US006653792B2

United States Patent
Joo

(10) Patent No.: US 6,653,792 B2
(45) Date of Patent: Nov. 25, 2003

(54) ION IMPLANTING SYSTEM

(75) Inventor: Young-Byeong Joo, Suwon (KR)

(73) Assignee: Samsung Electronics, Co., Ltd., Gyeonggi-do (KR)

( * ) Notice: Subject to any disclaimer, the term of this patent is extended or adjusted under 35 U.S.C. 154(b) by 0 days.

(21) Appl. No.: 10/164,612

(22) Filed: Jun. 10, 2002

(65) Prior Publication Data

US 2003/0001528 A1 Jan. 2, 2003

(30) Foreign Application Priority Data

Jun. 27, 2001 (KR) .......................... 2001-37071

(51) Int. Cl.[7] .......................... H01J 7/24; C23C 16/00; F04B 15/08

(52) U.S. Cl. .......................... 315/111.91; 315/111.81; 315/111.71; 118/723 VE; 118/723 FI; 118/723 FE; 417/901

(58) Field of Search ........................ 315/111.91, 111.81, 315/111.71, 111.21; 118/723 VE, 723 FI, 723 FE, 723 CB, 723 R, 733, 50; 417/901, 2, 3

(56) References Cited

U.S. PATENT DOCUMENTS

| 5,656,092 A | * | 8/1997 | Blake et al. .......... 118/723 VE |
| 5,879,467 A | * | 3/1999 | Zhou et al. .................... 134/19 |
| 5,971,711 A | * | 10/1999 | Noji et al. ...................... 417/2 |
| 6,288,357 B1 | * | 9/2001 | Dyer ...................... 219/121.41 |

* cited by examiner

Primary Examiner—Don Wong
Assistant Examiner—Tuyet T. Vo
(74) Attorney, Agent, or Firm—Harness, Dickey & Pierce, P.L.C.

(57) ABSTRACT

An ion implanting system including an ion implanting chamber for implanting an ion into a semiconductor wafer, a load lock chamber for loading the semiconductor wafer into the ion implanting chamber, a turbo pump for creating a high vacuum atmosphere in the load lock chamber, a low vacuum pump for creating a low vacuum atmosphere in the turbo pump, a cryo pump controller for generating a control signal to control a pumping operation of the turbo pump, a control voltage generator for generating a control voltage in response to the control signal generated from the cryo pump control, an interface for generating a starting signal in response to the control voltage, and a turbo pump controller for applying a voltage to operate the turbo pump and the low vacuum pump in response to the starting signal output from the interface.

9 Claims, 4 Drawing Sheets

ION IMPLANTING SYSTEM

CROSS REFERENCE

This application claims the benefit of Korean Patent Application No. 2001-37071, filed on Jun. 27, 2001, under 35 U.S.C. §119, the entirety of which is hereby incorporated by reference.

BACKGROUND OF THE INVENTION

1. Field of the Invention

The present invention relates to an ion implanting system, and more particularly, to a vacuum pump for an ion implanting system.

2. Description of Related Art

An ion implanting system includes a source chamber, an ion beam chamber, a main chamber, and a load lock chamber. Theses chambers include at least one vacuum pump for creating a vacuum atmosphere therein, respectively.

A conventional ion implanting system includes at least one cryo pump, usable as a vacuum pump, for creating a vacuum atmosphere in a main chamber and at least one cryo pump for creating a vacuum atmosphere in the load lock chamber. Further, the at least one cryo pump for creating a vacuum atmosphere in the load lock chamber is usually smaller in size and operated at higher revolutions per minute (rpm) than the at least one cryo pump for creating a vacuum atmosphere in the main chamber. Hence, the cryo pump(s) for creating a vacuum atmosphere in the load lock chamber is contaminated with impurities more easily than the cryo pump(s) for creating a vacuum atmosphere in the main chamber.

A cryo pump creates a vacuum atmosphere in a chamber by condensing and removing gas molecules that contact a cooling portion refrigerated by liquid hydrogen or liquid helium. When an inside of the cryo pump becomes saturated so that an inside temperature of the cryo pump rises, the cryo pump exhausts impurities therein during a regeneration operation. The regeneration operation includes inputting high temperature nitrogen gas into the cryo pump to vaporize the condensed impurities and outwardly exhaust the vaporized impurities.

In other words, when a cryo pump is contaminated with the impurities, an inside temperature of the cryo pump rises. When the inside temperature exceeds a set temperature, an error state is indicated, whereby an operation of the cryo pump is stopped. In order to clean an inside of the cryo pump, an operator initiates a regeneration operation.

Since the cryo pump for creating a vacuum atmosphere in the load lock chamber is contaminated with impurities more easily than the cryo pump for creating a vacuum atmosphere in the main chamber, the cryo pump for creating a vacuum atmosphere in the load lock chamber requires more frequent regeneration operations.

FIG. 1 is a block diagram illustrating a conventional ion implanting system. The ion implanting system of FIG. 1 includes a source chamber 10, an ion beam chamber 12, a main chamber 14, load lock chambers 16-1 to 16-3, a cryo pump controller 18, a compressor 20, a roughing pump 22, cryo pumps 24 to 32, and valves V1 to V14.

The source chamber 10 ionizes gas molecules externally injected. The ion beam chamber 12 accelerates ions input from the source chamber 10 to generate an ion beam. The main chamber 14 irradiates the ion beam from the ion beam chamber 12 into a semiconductor wafer (not shown). The load lock chambers 16-1 to 16-3 load/unload the semiconductor wafer into/from the main chamber 14. The cryo pumps 24 to 30 create a high vacuum atmosphere in the main chamber 14. The cryo pump 32 creates a high vacuum atmosphere in the load lock chambers 16-1 to 16-3 and vacuum lines VL2 to VL5. The valve V5 opens or closes a channel between the source chamber 10 and the ion beam chamber 12. The valve V6 opens or closes a channel between the ion beam chamber 12 and the main chamber 14. The valves V1 to V4 open or close channels between the main chamber 14 and the cryo pumps 24 to 30, respectively. The valves V7 to V9 open or close channels between the main chamber 14 and the load lock chambers 16-1 to 16-3, respectively. The value V10 opens or closes a channel between the cryo pump 32 and the vacuum line VL2. The cryo pump controller 18 applies control signals for controlling the cryo pumps 24 to 32, respectively, and generates an error signal in response to temperature sensing signals "a" to "e", respectively, applied from the cryo pumps when a temperature within the cryo pumps 24 to 32 exceeds a set temperature. The compressor 20 generates control voltages STARTA and RUNA to the cryo pumps 24 to 32 in response to the control signals applied from the cryo pump controller 18. STARTA and RUNA are shown in FIG. 1 as the control voltages for controlling the cryo pump 32.

A vacuum pumping operation of the ion implanting system of FIG. 1 is described below.

Semiconductor wafers (not shown) are loaded into cassettes (not shown) of the load lock chambers 16-1 to 16-3. The valves V11 to V14 are opened, and the valve V10 is closed. A low vacuum atmosphere is created in the load lock chambers 16-1 to 16-3 and the vacuum lines VL1 to VL5 by the roughing pump 22. The roughing pump 22 performs a pumping operation to maintain a pressure of about $10^{-2}$ torr.

The valve V11 is closed, and the valves V10 and V12 to V14 are opened. A high vacuum atmosphere is created in the load lock chambers 16-1 to 16-3 and the vacuum lines VL2 to VL5 by the cryo pump 32. A high vacuum atmosphere is created such that compressed helium gas from the compressor 20 into the cryo pump 32 reduces a temperature of a gas to be refrigerated. The roughing pump 22 performs a pumping operation to maintain to a pressure of about $10^{-6}$ torr to about $10^{-5}$ torr. The cryo pump 32 performs a pumping operation to create a high vacuum atmosphere in the load lock chambers 16-1 to 16-3 and the vacuum lines VL2 to VL5 when the compressor 20 applies the control voltages STARTA and RUNA to the cryo pump 32 in response to the control signal applied from the cryo pump controller 18.

The valves V7 to V9 arranged between the main chamber 14 and the load lock chambers 16-1 to 16-3 are opened, and the cassettes of the load lock chambers 16-1 to 16-3 that load the semiconductor wafers are placed into the main chamber 14. Thereafter, an ion implanting process is performed.

However, since the cryo pump 32 for creating a vacuum in the load lock chambers 16-1 to 16-3 is smaller in size and operates at higher revolutions per minute (rpm) than the cryo pumps 24 to 30 for creating a vacuum in the main chamber 14, the cryo pump 32 is more easily contaminated than the cryo pumps 24 to 30.

A temperature sensing diode (not shown) detects whether the cryo pump 32 is contaminated or not. The cryo pump controller 18 receives a temperature sensing signal "a" output from the cryo pump 32 and indicates an error state when a temperature inside the cryo pump 32 exceeds a set temperature, thereby stopping an operation of the ion implanting system. The cryo pump 32 performs a regeneration operation to remove the impurities therein and normal operation may continue.

The regeneration operation is performed as follows: nitrogen ($N_2$) gas is input to the cryo pump 32, and therefore an inside pressure of the cryo pump 32 rises and reaches a set pressure of an attached relief valve (not shown). The relief valve is opened to outwardly exhaust the impurities and the nitrogen gas inside the cryo pump 32.

As a result, in the conventional ion implanting system, when the inside temperature of the cryo pump 32 exceeds a set temperature, an error occurs, whereupon a regeneration operation should be performed after stopping the ion implanting system. Also, the ion implanting process cannot be continued until the regeneration operation is completed.

As described above, in a conventional ion implanting system, a cryo pump for creating a vacuum atmosphere in the load lock chamber is easily contaminated, and a regeneration operation should be performed often, which lowers the operational performance of the conventional ion implanting system.

SUMMARY OF THE INVENTION

To overcome the problems described above, exemplary embodiments of the present invention describe an ion implanting system having higher operational performance.

At least one exemplary embodiment of the present invention provide an ion implanting system, including an ion implanting chamber for implanting an ion into a semiconductor wafer; a load lock chamber for loading the semiconductor wafer into the ion implanting chamber; a turbo pump for creating a high vacuum atmosphere in the load lock chamber; a low vacuum pump for creating a low vacuum atmosphere in the turbo pump; a cryo pump controller for generating a control signal to control a pumping operation of the turbo pump; a control voltage generator for generating a control voltage in response to the control signal generated from the cryo pump controller; an interface for generating a starting signal in response to the control voltage; and a turbo pump controller for applying a voltage to operate the turbo pump and the low vacuum pump in response to the starting signal output from the interface.

The control voltage generator may be a compressor. The interface may include at least two converters, the first converter converting the control voltage into a digital signal to generate the starting signal, the second converter converting a normal operation sensing signal output from the turbo pump controller into an analog signal to generate a temperature sensing output signal. The first converter may include a first relay operating in response to the control voltage, and a first switch turning on, when the first relay is operated, to generate the starting signal. The second converter may include a second relay operating in response to the normal operation sensing signal, and a current converting circuit for converting a current of the temperature sensing output signal when the second relay is operated.

The current converting circuit may include two diodes serially connected and generate the temperature sensing output signal, and a second switch connected between the two diodes, the second switch connecting both of the two diodes when the second relay is not operated and connecting either of the two diodes when the second relay is operated. The interface may further include an overload sensor for applying the voltage to the low vacuum pump in response to the control voltage and for cutting off the voltage when an overload of the low vacuum pump is sensed. The overload sensor may include a third switch for applying the voltage to the low vacuum pump in response to the control voltage, and a third relay for applying the voltage transferred from the third switch to the low vacuum pump and for cutting off the voltage when an overload of the low vacuum voltage is sensed. The turbo pump controller may include a starter for applying the voltage to the turbo pump in response to a signal applied from the first converter, and a normal operation sensor for receiving a signal applied from the turbo pump to sense a normal operation of the turbo pump in order to generate the normal operation sensing signal.

BRIEF DESCRIPTION OF THE DRAWINGS

For a more complete understanding of the present invention and the advantages thereof, reference is now made to the following descriptions taken in conjunction with the accompanying drawings, in which like reference numerals denote like parts, and in which.

DETAILED DESCRIPTION OF PREFFERED EMBODIMENTS

Reference will now be made in detail to exemplary embodiments of the present invention, examples of which are illustrated in the accompanying drawings.

Figure 1:
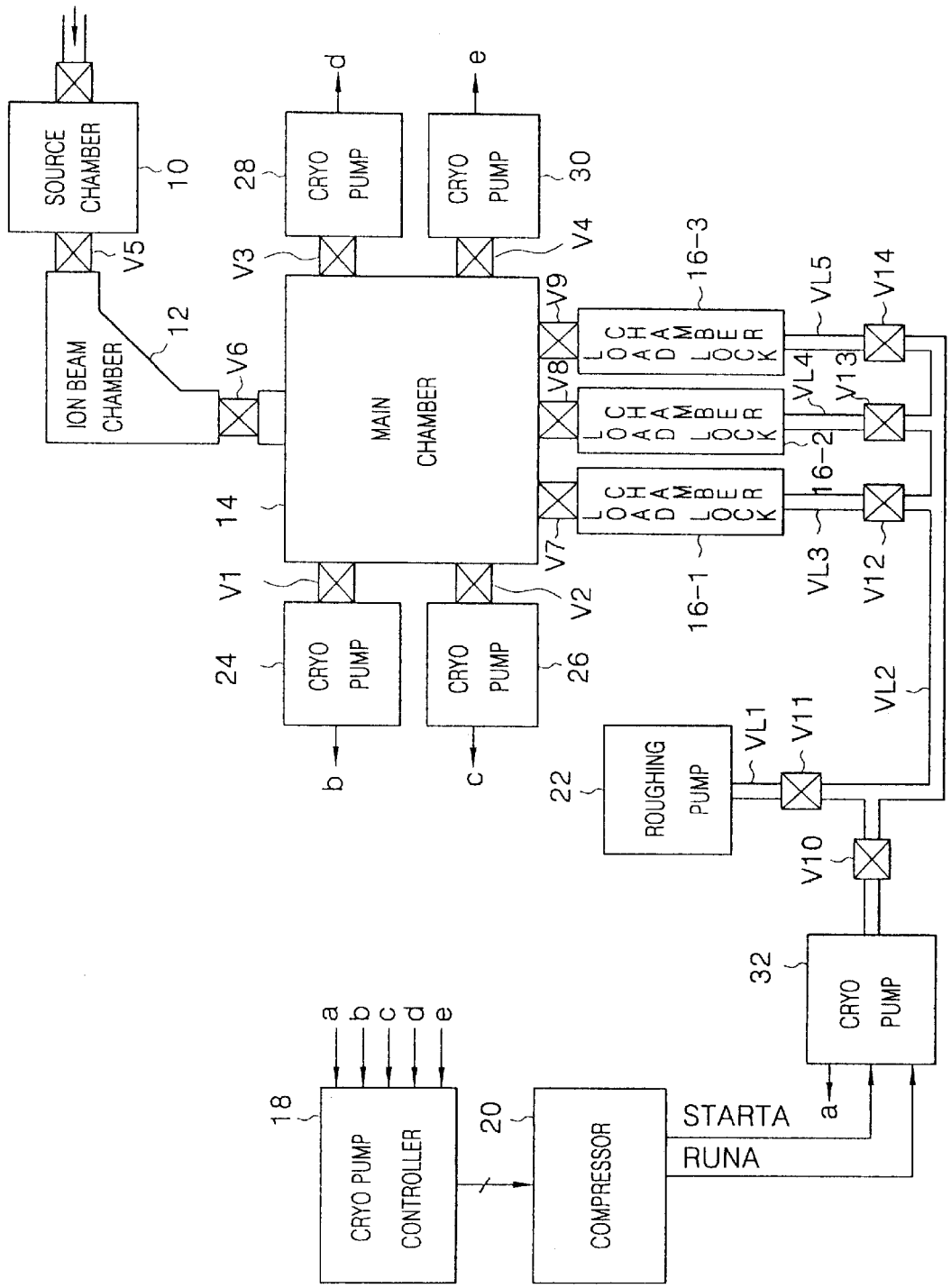
FIG. 1 is a block diagram illustrating a conventional ion implanting system.
Figure 2:
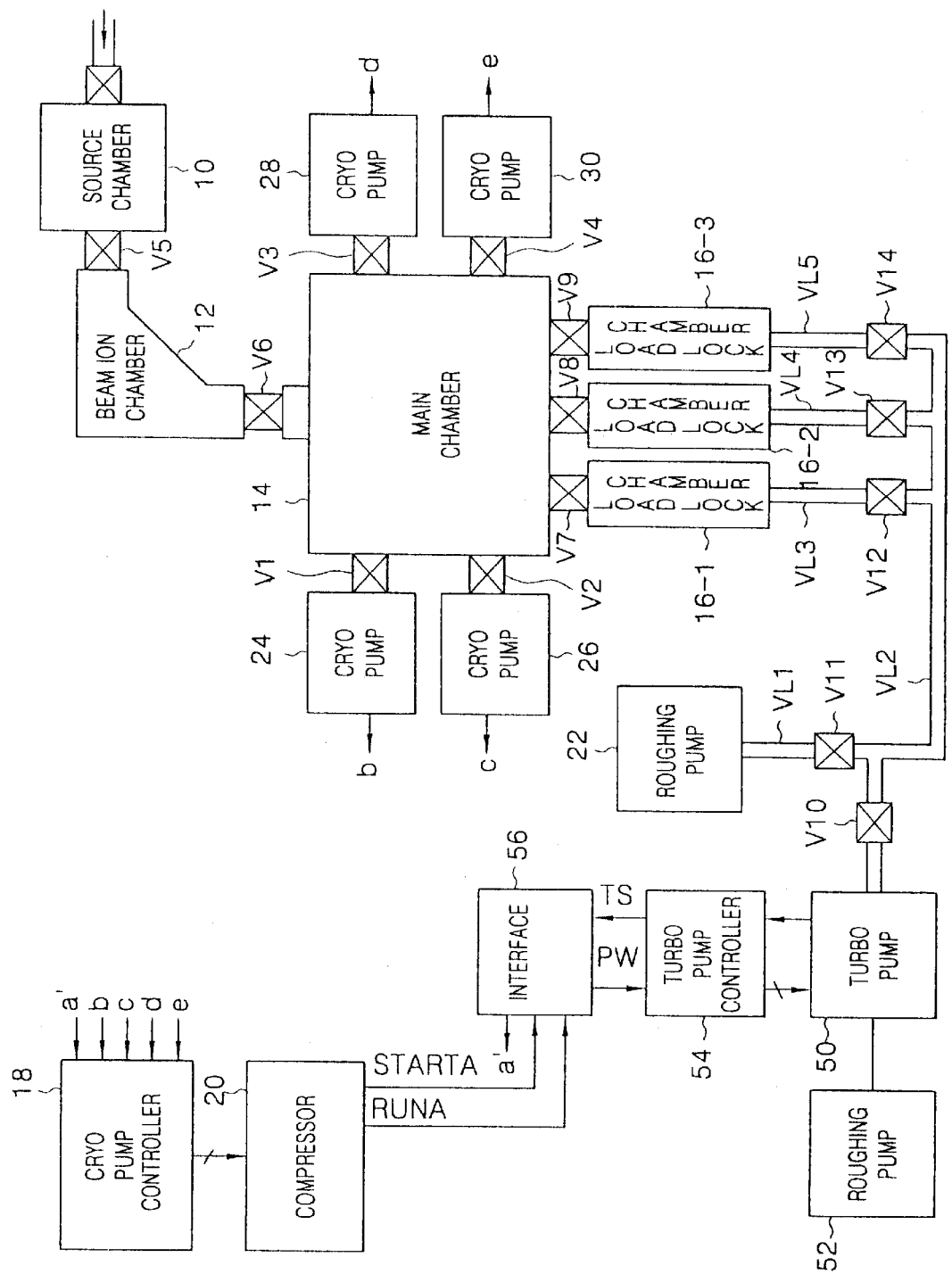
FIG. 2 is a block diagram illustrating an ion implanting system according to an exemplary embodiment of the present invention.

FIG. 2 is a block diagram illustrating an ion implanting system according to an exemplary embodiment of the present invention. The ion implanting system of FIG. 2 includes a turbo pump 50, a roughing pump 52, a turbo pump controller 54 and an interface 56 instead of the cryo pump 32 of FIG. 1. Like reference numerals of FIGS. 1 and 2 denote like components and perform like operations.

The turbo pump 50 serves to pump the load lock chambers 16-1 to 16-3. The roughing pump 52 creates a vacuum in the turbo pump 50, and the turbo pump controller 54 controls an operation of the turbo pump 50.

Input and output (I/O) signals to and from the turbo pump controller 54, i.e., a starting signal PW and a normal operation sensing signal TS, may be digital signals, and control voltages STARTA and RUNA and a temperature sensing signal "a'" may be analog signals. The interface 56 is arranged to enable signal transmission between the compressor 20 and the turbo pump controller 54. The interface 56 converts the control voltage STARTA and RUNA outputted from the compressor 20 into digital signals and applies them to the turbo pump controller 54. Also, the interface 56 converts the normal operation sensing signal TS into analog signals to generate the temperature sensing signal "a'" and apply it to the cryo pump controller 18.

In other words, instead of the cryo pump 32 of FIG. 1 that often requires a regeneration operation, the ion implanting system of FIG. 2 includes the turbo pump 50 that does not perform a regeneration operation to create a high vacuum atmosphere in the load lock chambers 16-1 to 16-3.

A vacuum pumping operation of the ion implanting system of FIG. 2 is described below.

The valve V10 is closed, and the valves V11 to V14 are opened. The roughing pump 22 performs a pumping operation to create a low vacuum atmosphere in the vacuum lines VL1 to VL5 and the load lock chambers 16-1 to 16-3.

The cryo pump controller 18 applies a control signal for controlling the turbo pump 50 to the compressor 20. The compressor 20 outputs the control voltages STARTA and RUNA. The interface 56 converts the control voltages STARTA and RUNA into digital signals to output the starting signal PW, and converts the normal operation sensing signal TS into an analog signal to generate the temperature sensing output signal "a'". When an overload is generated in a motor of the roughing pump 52, the interface 56 also cuts off application of the starting signal PW to the turbo pump controller 54, and cuts off the applied voltage to the roughing pump 52, thereby stopping an operation of the turbo pump 50 and the roughing pump 52.

The turbo pump controller 54 applies a voltage to the turbo pump 50 in response to the starting signal PW, and receives signals applied from the turbo pump 50 in order to sense a normal operation to generate the normal operation sensing signals TS. The turbo pump 50 receives a voltage applied in response to the starting signal PW to perform a high vacuum pumping operation. The roughing pump 52 receives an applied voltage to perform a low vacuum pumping operation.

Figure 3:
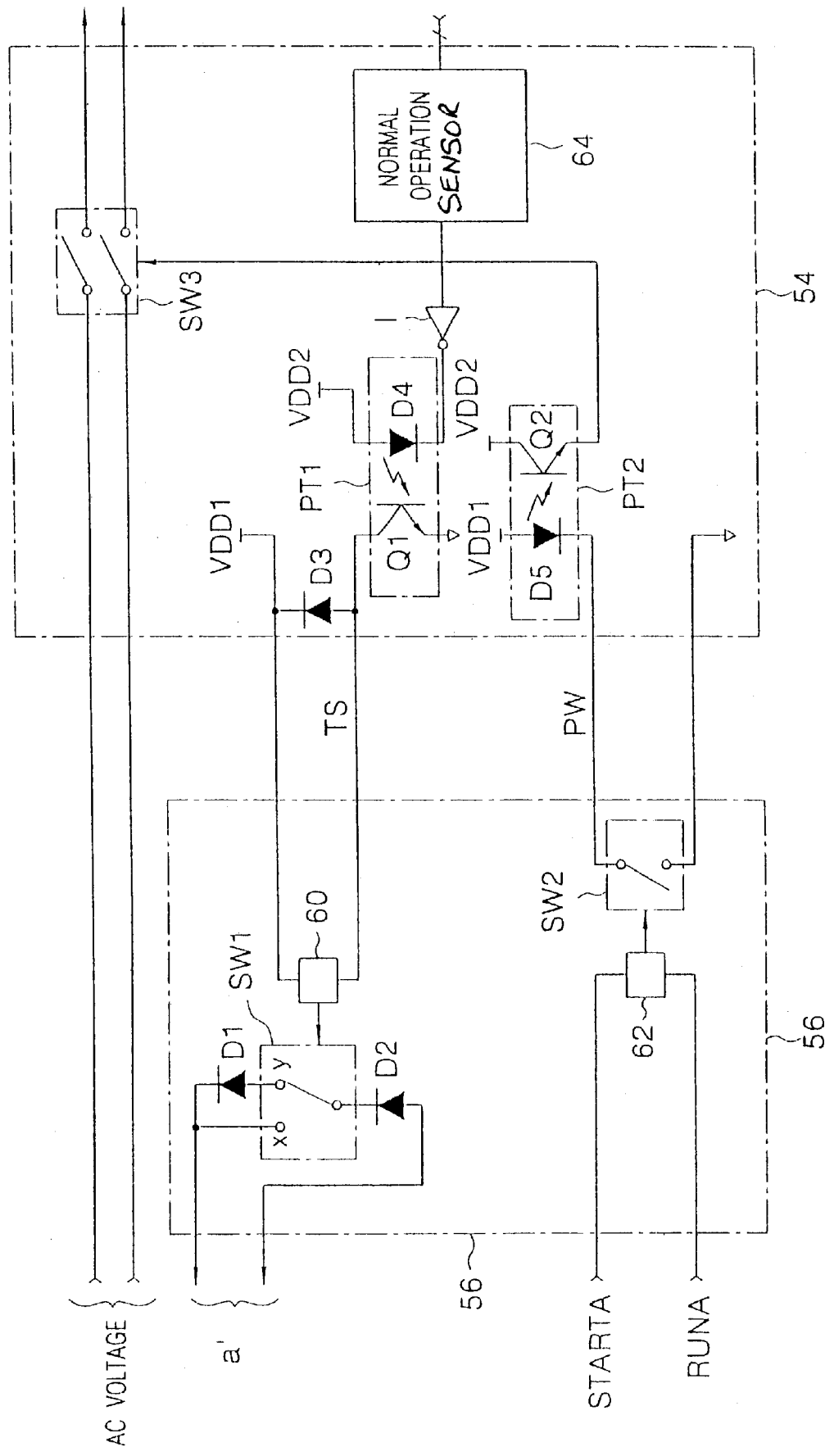
FIG. 3 is a circuit diagram illustrating an exemplary embodiment of a turbo pump controller and the interface of FIG. 2.

FIG. 3 is a circuit diagram illustrating an exemplary embodiment of the turbo pump controller 54 and the interface 56 of FIG. 2.

The interface 56 includes diodes D1 and D2, switches SW1 and SW2, and relays 60 and 62. The turbo pump controller 54 includes a diode D3, photo couplers PT1 and PT2, a switch SW3, an inverter I and a normal operation sensor 64. The photo coupler PT1 includes a transistor Q1 and a diode D4, and the photo coupler PT2 includes a transistor Q2 and a diode D5.

When an operation of the circuit of FIG. 3 is not performed, the switch SW1 is connected to a contact point "y", and the switches SW2 and SW3 are opened.

When the control signals STARTA and RUNA are applied so as to perform a pumping operation, the relay 62 operates to close the switch SW2. When the starting signal PW is generated, a current flows through the diode D5, whereby light is emitted. The transistor Q2 is turned on to close the switch SW3, and an AC voltage is applied to the turbo pump 50 and the roughing pump 52, whereupon the turbo pump 50 and the roughing pump 52 perform a pumping operation.

When the turbo pump 50 performs a pumping operation abnormally, the normal operation sensor 64 receives a signal applied to the turbo pump 50 to generate a signal having a logic "high" level. The inverter I inverts the signal having a logic "high" level to generate a signal having a logic "low" level. Hence, a current flows through the diode D4, and light is emitted, whereupon the transistor Q1 is turned on. When the transistor Q1 is turned on, the relay 60 operates to make the switch SW1 contact to a contact point "x". Consequently, a current flows through only the diode D2. That is, an amount of current for the temperature sensing signal "a'" increases.

On the other hand, when the turbo pump 50 performs a pumping operation normally, the normal operation sensor 64 receives a signal applied from the turbo pump 50 to generate a signal having a logic "low" level. The inverter I inverts the signal having a logic "low" level to generate a signal having a logic "high" level. Hence, the relay 60 does not operate, whereupon the switch SW1 contacts the contact point "y"

"as is". Consequently, current flows through the diodes D1 and D2, and an amount of a current for the temperature sensing signal "a'" is maintained "as is".

The cryo pump controller 18 receives the temperature sensing signal "a'" and determines whether the current of the temperature sensing signal "a'" has increased or not. When the current of the temperature sensing signal "a'" has increased, the cryo pump controller 18 determines that the temperature has risen, thereby indicating an error state. However, if the current of the temperature sensing signal "a'" is substantially the same, the cryo pump controller 18 determines that a pumping operation being performed normally.

As described above, signal transmission between the compressor 20 and the turbo pump controller 54 and between the cryo pump controller 18 and the turbo pump controller 54 is performed by the interface 56.

Figure 4:
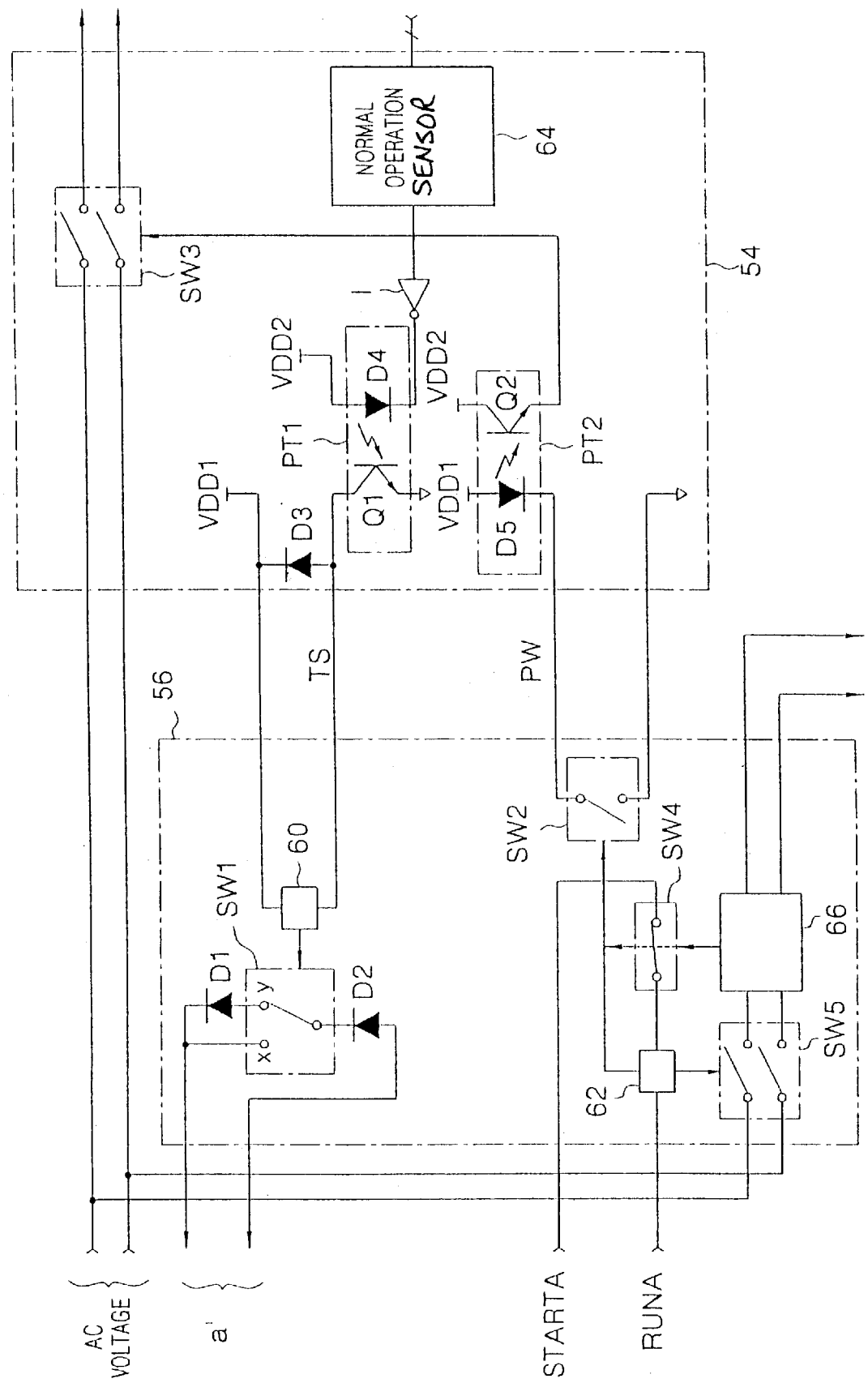
FIG. 4 is a circuit diagram illustrating another exemplary embodiment of the turbo pump controller and the interface of FIG. 2.

FIG. 4 is a circuit diagram illustrating an another exemplary embodiment of the turbo pump controller 54 and the interface 56 of FIG. 2. The circuit of FIG. 4 further includes switches SW4, SW5 and a relay 66 added to the circuit of FIG. 3. Like reference numerals of FIGS. 3 and 4 denote like components and perform like operations. The relay 66 senses an overload differently from the relays 60 and 62 as described below.

When an operation of the circuit of FIG. 4 is not performed, the switch SW5 is opened, and the switch SW4 is closed.

When the control voltages STARTA and RUNA are applied so as to perform a pumping operation, the relay 62 operates to close the switch SW5, and an AC voltage is applied to the switch SW5 and the relay 66. Therefore, the roughing pump 52 performs a pumping operation.

When an overload is generated in the roughing pump 52 and a current flowing through a motor of the roughing pump 52 increases, the relay 66 operates to cut off an applied voltage to the roughing pump 52. Also, the switches SW3 and SW4 are closed, and therefore an applied voltage to the turbo pump 50 is cut off, thereby stopping an operation of the turbo pump 50 and the roughing pump 52.

As described above, one or more exemplary embodiments of the present invention include a turbo pump instead of a cryo pump for creating a vacuum in the load lock chambers, and therefore, a regeneration operation is not required, which improves the operational performance of the ion implanting system.

While the invention has been particularly shown and described with reference to exemplary embodiments thereof, it will be understood by those skilled in the art that the foregoing and other changes in form and details may be made therein without departing from the spirit and scope of the invention.

What is claimed is:

1. An ion implanting system, comprising:

an ion implanting chamber for implanting an ion into a semiconductor wafer;

a load lock chamber for loading the semiconductor wafer into the ion implanting chamber;

a turbo pump for creating a high vacuum atmosphere in the load lock chamber;

a low vacuum pump for creating a low vacuum atmosphere in the turbo pump;

a cryo pump controller for generating a control signal to control a pumping operation of the turbo pump;

a control voltage generator for generating a control voltage in response to the control signal generated from the cryo pump controller;

an interface for generating a starting signal in response to the control voltage; and a turbo pump controller for applying a voltage to operate the turbo pump and the low vacuum pump in response to the starting signal output from the interface.

2. The system of claim 1, wherein the control voltage generator is a compressor.

3. The system of claim 1, wherein the interface includes at least first and second converters, the first converter converting the control voltage into a digital signal to generate the starting signal, the second converter converting a normal operation sensing signal output from the turbo pump controller into an analog signal to generate a temperature sensing output signal.

4. The system of claim 3, wherein the first converter includes a first relay operating in response to the control voltage, and a first switch turning on, when the first relay is operated, to generate the starting signal.

5. The system of claim 3, wherein the turbo pump controller includes a starter for applying the voltage to the turbo pump in response to a signal applied from the first converter, and a normal operation sensor for receiving a signal applied from the turbo pump to sense a normal operation of the turbo pump in order to generate the normal operation sensing signal.

6. The system of claim 3, wherein the second converter includes a second relay operating in response to the normal operation sensing signal, and a current converting circuit for converting a current of the temperature sensing output signal when the second relay is operated.

7. The system of claim 6, wherein the current converting circuit includes at least two diodes serially connected and generating the temperature sensing output signal, and a second switch connected between the two diodes, the second switch connecting both of the two diodes when the second relay is not operated and connecting either of the two diodes when the second relay is operated.

8. The system of claim 3, wherein the interface further includes an overload sensor for applying the voltage to the low vacuum pump in response to the control voltage and for cutting off the voltage when an overload of the low vacuum pump is sensed.

9. The system of claim 8, wherein the overload sensor includes a third switch for applying the voltage to the low vacuum pump in response to the control voltage, and a third relay for applying the voltage transferred from the third switch to the low vacuum pump and for cutting off the voltage when an overload of the low vacuum voltage is sensed.

* * * * *